United States Patent [19]
Idacavage et al.

[11] Patent Number: 5,989,781
[45] Date of Patent: Nov. 23, 1999

[54] METHOD FOR PRODUCING PRINTING PLATES

[75] Inventors: Michael J. Idacavage, Marietta, Ga.; Robert W. Kelsall, San Diego, Calif.

[73] Assignee: NAPP Systems, Inc., San Marcos, Calif.

[21] Appl. No.: 08/900,183

[22] Filed: Jul. 25, 1997

Related U.S. Application Data

[63] Continuation-in-part of application No. 08/460,245, Jun. 2, 1995, abandoned.

[51] Int. Cl.$^6$ .............................. F26B 3/347; F26B 9/00; G03C 1/00; G03C 11/16
[52] U.S. Cl. .......................... 430/309; 430/325; 430/328; 430/330; 427/541; 427/542; 427/553; 427/577; 34/259
[58] Field of Search ..................................... 430/309, 325, 430/328, 330; 427/541, 542, 553, 577; 34/259

[56] References Cited

U.S. PATENT DOCUMENTS

| | | | |
|---|---|---|---|
| 4,243,744 | 1/1981 | Lockwood et al. | 430/325 |
| 4,777,115 | 10/1988 | Koch et al. | 430/281 |
| 5,073,477 | 12/1991 | Kusuda et al. | 430/287 |
| 5,137,964 | 8/1992 | Lewis et al. | 524/550 |
| 5,153,106 | 10/1992 | Liu | 430/340 |
| 5,175,076 | 12/1992 | Ishikawa et al. | 430/281 |
| 5,176,986 | 1/1993 | Telser et al. | 430/306 |
| 5,232,820 | 8/1993 | Lewis et al. | 430/338 |
| 5,240,815 | 8/1993 | Telser et al. | 430/306 |
| 5,290,663 | 3/1994 | Huynh-Tran | 430/284 |
| 5,348,844 | 9/1994 | Garmong | 430/286 |
| 5,364,741 | 11/1994 | Huynh-Tran et al. | 430/300 |
| 5,407,784 | 4/1995 | Berrier et al. | 430/287 |

OTHER PUBLICATIONS

Bloomquist and Willett, "Thermochromic Phase Transitions in Transition Metal Salts" *Coordination Chemistry Reviews* 47: 125–164 (1982).

*Primary Examiner*—Mark F. Huff
*Attorney, Agent, or Firm*—Gray Cary Ware & Friedenrich; Stephen E. Reiter; Ramsey R. Stewart

[57] ABSTRACT

In accordance with the present invention, there are provided methods for producing printing plates comprising rapid, efficient drying of solvent-containing resin compositions of the printing plates and apparatus useful therefor. Printing plates processed employing invention methods and apparatus are ready for use in printing applications in a relatively short period of time, especially compared to the time required for conventional convection drying. Moreover, printing plates processed according to the present invention method and apparatus are not subjected to excessive levels of heat, as is frequently the case with conventional convection drying. Excessive heating tends to be detrimental to the performance properties of the polymeric resin. In a particular aspect of the present invention, there are provided novel compositions which, upon drying according to the methods described herein, undergo a color change, thereby indicating when the drying process is substantially complete. When used for the production of printing plates, invention compositions provide finished printing plates which display a readily observed contrast between the floor and image portions thereof.

17 Claims, 2 Drawing Sheets

METHOD FOR PRODUCING PRINTING PLATES

RELATED APPLICATIONS

This application is a continuation-in-part of U.S. application Ser. No. 08/460,245, filed Jun. 2, 1995 now abandoned, the entire contents of which are hereby incorporated by reference herein.

FIELD OF THE INVENTION

The present invention relates to methods for processing water-developable photosensitive printing plates, and apparatus useful therefor.

BACKGROUND OF THE INVENTION

Photosensitive resin plates used in the manufacture of relief printing plates are developed by washing with water and/or organic solvents. Once development of exposed plates (i.e., washing to remove unexposed resin therefrom) is complete, it is desirable to remove residual solvent from the exposed resin prior to further processing of the resin plate. Failure to do so will compromise the integrity of the plate upon final curing, for example by cracking, fracturing, shrinking, warping, etc., and lead to poor print quality if the plate is not sufficiently dried.

Currently, thermal convection ovens are employed in the art for such purpose. There are, however, numerous drawbacks to the present methods employed for drying solvent-containing resins. For example, present methods are highly energy inefficient, since the entire resin plate is heated in efforts to drive off solvent (instead of selectively heating only that portion of the resin which is targeted for solvent removal), convection ovens have long heat-up and cool-down cycles, ovens must be maintained at an elevated temperature for extended periods of time if rapid drying on demand is desired, very large ovens (with the associated space and utility requirements) are necessary when continuous drying processes are contemplated, and the like. In addition, there is a substantial potential for exposing the resin to excessive levels of heat in efforts to achieve an acceptable level of drying. Such exposure can have a variety of detrimental effects on resin performance, e.g., degradation of the polymeric resin, cracking of the resin, curling of the resin plate, and the like.

Accordingly, what is needed in the art are more energy efficient methods than are currently available for removing diluent from polymeric resin materials. Especially useful would be methods for removing diluent from polymeric resin materials without compromising the chemical and physical properties of said resin.

BRIEF DESCRIPTION OF THE INVENTION

In accordance with the present invention, we have developed methods of producing printing plates comprising rapid, efficient drying of vehicle-containing resin coatings on printing plates, and apparatus useful therefor. Printing plates processed employing invention methods and apparatus are ready for use in printing applications in a relatively short period of time, especially compared to the time required for conventional convection drying. Moreover, printing plates processed according to the present invention method and apparatus are not subjected to excessive levels of heat, as is frequently the case with conventional convection drying. Excessive heating tends to be detrimental to the performance properties of the polymeric resin.

In a particular aspect of the present invention, there are provided novel compositions which, upon drying according to the methods described herein, undergo a color change, thereby indicating when the drying process is substantially complete. When used for the production of printing plates, invention compositions provide finished printing plates which display a readily observed contrast between the floor and image portions thereof.

DETAILED DESCRIPTION OF THE INVENTION

Figure 1:
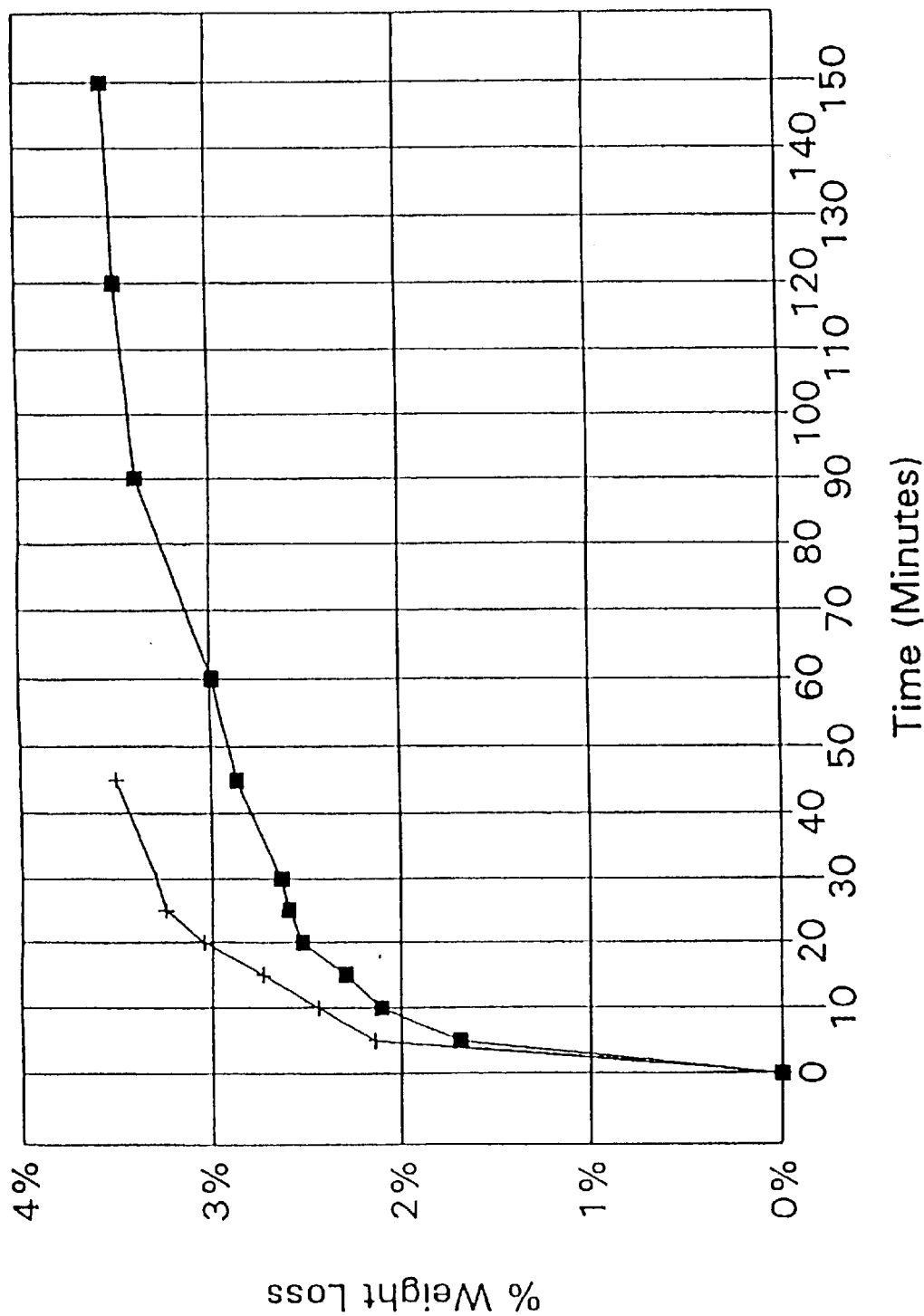
FIG. 1 compares the drying profile of Flexcel™ (Trademark of Napp Systems Inc.) photopolymerizable plates in a forced air oven (maintained at ~60° C., denoted by darkened boxes, ■ , in the figure) and in a microwave (operating at 300 Watts, denoted by "+" in the figure). Ten inch square plates were employed.

In accordance with the present invention, there are provided methods of producing printing plates which comprise applying, to a microwave-compatible support, a coating comprising a photosensitive, polymerizable resin which is dispersed in a suitable vehicle, and subjecting said coating to microwave energy in a sufficient amount to substantially reduce the concentration of said vehicle in said coating.

A wide variety of resins are contemplated for use in the practice of the present invention. As used herein, "resin" refers to any solid or semisolid organic composition of natural or synthetic origin which has no definite melting point. Such compositions are generally of relatively high molecular weight. Polymerizable as well as non-polymerizable resins can be treated by the invention method. Polymerizable resins can be polymerized in a variety of ways, e.g., photopolymerization, thermally induced polymerization, and the like. Regardless of how polymerized, any resin can be treated in accordance with the present invention.

For example, various photosensitive resin compositions are well known in the art, such as photosensitive resin compositions employed for the preparation of conventional photosensitive resin plates. Such materials are based on a variety of reactive materials, such as, for example, liquid unsaturated polyesters, polyvinyl alcohols, water soluble polyamides, polyurethanes, cellulose acetate succinates, alcohol soluble polyamides, water-developable acrylic polymers, and the like. All of the above-described resins can be treated by the invention method.

Exemplary resins contemplated for use in the practice of the present invention are polymerizable resins which are capable of crosslinking to produce a substantially insoluble coating on a microwave-compatible support. With such compositions, the polymerizable resin is exposed to crosslinking conditions, then the uncured resin is removed from said support by washing with a suitable solvent. A specific class of resins contemplated for use in the practice of the present invention are photosensitive resins, such as, for example, any one of the photoreactive resin systems disclosed by Huynh-Tran et al., in U.S. Pat. No. 5,364,741, incorporated by reference herein in its entirety, any one of the photoreactive resin systems disclosed by Huynh-Tran, in U.S. Pat. No. 5,290,663, incorporated by reference herein in its entirety, any one of the photoreactive resin systems disclosed by Berrier et al., in U.S. Pat. No. 5,407,784, incorporated by reference herein in its entirety, any one of the photoreactive resin systems disclosed by Koch et al., in U.S. Pat. No. 4,777,115, incorporated by reference herein in its entirety, any one of the photoreactive resin systems disclosed by Telser et al., in U.S. Pat. No. 5,176,986, incorporated by reference herein in its entirety, any one of the photoreactive resin systems disclosed by Telser et al., in U.S. Pat. No. 5,240,815, incorporated by reference herein in its entirety, any one of the photoreactive resin systems disclosed by Ishikawa et al., in U.S. Pat. No. 5,175,076, incorporated by reference herein in its entirety, any one of the photoreactive resin systems disclosed by Wagner in U.S. Pat. No. 5,348,844, incorporated by reference herein in its entirety, any one of the photoreactive resin systems disclosed by Kusuda et al., in U.S. Pat. No. 5,073,477, incorporated by reference herein in its entirety, any one of the photoreactive resins disclosed by Idacavage et al., in U.S. patent application Ser. No. 08/324,730, now abandoned, incorporated by reference herein in its entirety, any one of the photoreactive resins disclosed by Roberts et al., in U.S. patent application Ser. No. 08/122,906, now abandoned, incorporated by reference herein in its entirety, and the like.

The above-described photopolymerizable resin compositions can be dispersed in various vehicles, including aqueous media, i.e., water, optionally containing base, acid, surfactant, and/or up to about 99% vol % organic media. Such resin compositions can, therefore, be exposed to electromagnetic radiation sufficient to cause at least a portion thereof to cure, and the uncured resin thereafter removed from the support by washing with the corresponding vehicle in which such resin was previously dispersed.

A presently preferred resin composition for use in the practice of the present method comprises:

(A) in the range of about 30 up to 90 wt % of a copolymer comprising in the range of:
  (i) 5 up to 95 mol % of an aliphatic conjugated diene monomer,
  (ii) 1 up to 30 mol % of an α,β-ethylenically unsaturated carboxylic acid,
  (iii) 0.1 up to 10 mol % of a polyfunctional vinyl monomer, and
  (iv) 0 up to 70 mol % of a monofunctional vinyl monomer;

(B) in the range of about 0.2 up to 2 mol of a basic nitrogen-containing compound per mol of carboxyl groups in copolymer (A), (C) in the range of about 5 up to 70 wt % of at least one ethylenically unsaturated monomer having an acrylate core structure, i.e.,:

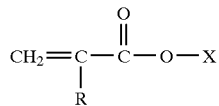

wherein R is H or methyl, and X is selected from:
  (a) an alkyl group having in the range of about 8 up to 15 carbon atoms,

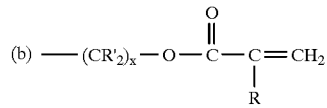

wherein each R' is independently selected from H or methyl, R is as defined above, selected independently of R of the core structure, and x is an integer falling in the range of about 2 up to 6, (C)—[(CH$_2$)$_{x'}$,—O]$_y$—Y
  wherein x' is an integer falling in the range of about 1 up to 12, y is an integer falling in the range of about 4 up to 12, and Y is selected from:
  alkyl having in the range of about 3 up to 15 carbon atoms such that two or more of the core species can be linked to one another, or

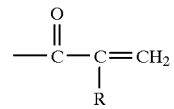

wherein R is as defined above and is selected independently of R of the core structure, and

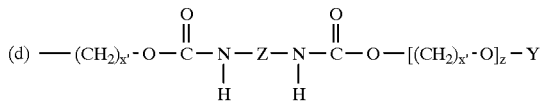

wherein x' and Y are as defined above, Z is an aliphatic, aromatic, aliphatic-substituted aromatic, or aromatic-substituted aliphatic linker having a molecular weight in the range of about 4,000–5,000, and z is an integer which falls in the range of about 0 up to 10, and (D) in the range of about 0.01 up to 10 wt % of at least one photopolymerization initiator.

Optionally, resin compositions employed in the practice of the present invention further comprise in the range of about 0.5 up to 10 wt % polybutadiene.

Optionally, resin compositions employed in the practice of the present invention can still further contain a thermally sensitive dye therein. Such dyes will impart a color change to the treated plate only in the area of the product where sufficient heat is generated by the drying process. Since microwave drying as contemplated herein locally heats the article being dried at only those portions of the article where solvent resides and awaits expulsion, a temperature sensitive dye can be employed to provide contrast between different portions of the treated article.

Exemplary thermally sensitive dyes contemplated for use in the practice of the present invention include thermochromic quaternized polyacetylene salt derivatives such as those described in U.S. Pat. Nos. 5,137,964 and 5,232,820, both of which are incorporated by reference herein; thermosensitive aryl diacetylenes such as those described in U.S. Pat. No. 5,153,106, incorporated by reference herein; thermochromic transition metal salts, such as those described by Bloomquist and Willett in *Coord. Chem. Rev.* 47:125–164 (1982), and the like.

Copolymers contemplated for use as part of the above-described resin compositions are themselves prepared from a combination of several components, e.g., an aliphatic conjugated diene monomer, an $\alpha,\beta$-ethylenically unsaturated carboxylic acid, a polyfunctional vinyl monomer, and optionally a monofunctional vinyl monomer. Typically, such compositions comprise in the range of about:

(i) 5 up to 95 mol % of an aliphatic conjugated diene monomer, (ii) 1 up to 30 mol % of an $\alpha,\beta$-ethylenically unsaturated carboxylic acid, (iii) 0.1 up to 10 mol % of a polyfunctional vinyl monomer, and (iv) 0 up to 70 mol % of a monofunctional vinyl monomer.

Presently preferred copolymer compositions employed in the practice of the present invention comprise in the range of:

(i) 40 up to 85 mol % of an aliphatic conjugated diene monomer, (ii) 2.5 up to 15 mol % of an $\alpha,\beta$-ethylenically unsaturated carboxylic acid, (iii) 0.5 up to 5 mol % of a polyfunctional vinyl monomer, and (iv) 5 up to 30 mol % of a monofunctional vinyl monomer.

Aliphatic conjugated diene monomers contemplated for use in the above-described photopolymerizable compositions include butadiene, isoprene, chloroprene, dimethylbutadiene and the like.

$\alpha,\beta$-ethylenically unsaturated carboxylic acids contemplated for use in the above-described photopolymerizable compositions include methacrylic acid, acrylic acid, itaconic acid, maleic acid, and the like.

Polyfunctional vinyl monomers contemplated for use in the above-described photopolymerizable compositions include ethyleneglycol dimethacrylate, divinyl benzene, 1,6-hexanediol diacrylate, 1,4-butanediol diacrylate, and the like.

Monofunctional vinyl monomers contemplated for use in the above-described photopolymerizable compositions include ethyl acrylate, methyl acrylate, hydroxyethyl methacrylate, methyl methacrylate, $\beta$-carboxyethyl acrylate, and the like, as well as mixtures of any two or more thereof.

Basic nitrogen-containing compounds contemplated for use in the above-described photopolymerizable compositions include dimethylaminopropyl methacrylamide (DMAPMA), N-dialkylaminoalkyl (meth)acrylamide, alkylamino (meth)acrylamide, N-vinyl pyrrolidone, and the like.

Ethylenically unsaturated monomers having an acrylate core structure contemplated for use in the above-described photopolymerizable compositions include 1,4-butanediol dimethacrylate, lauryl methacrylate, polyethylene glycol (400) dimethacrylate, highly ethoxylated trimethylol propane triacrylate, propoxylated neopentyl glycol diacrylate, ethyoxylated neopentylglycol di(meth)acrylate, polyethylene glycol (600) di(meth)acrylate, isobornyl acrylate, 1,6-hexanediol di(meth)acrylate, ethoxylated bisphenol A di(meth)acrylate, cyclohexyl(meth)acrylate, diethylene glycol di(meth)acrylate, glycerol di(meth)acrylate, aliphatic urethane di(meth)acrylate, and the like. Presently preferred ethylenically unsaturated monomers contemplated for use in the practice of the present invention include 1,4-butanediol dimethacrylate, lauryl methacrylate, polyethylene glycol (400) dimethacrylate, highly ethoxylated trimethylol propane triacrylate, aliphatic urethane diacrylate, and the like.

Those of skill in the art recognize that a wide range of photopolymerization initiators can be used in the above-described photopolymerizable resin compositions. The initiator (A) used in the above-described resin compositions includes ordinary photoreaction initiators such as $\alpha$-diketone compounds (e.g., diacetyl, benzil, and the like), acyloins (e.g., benzoin, pivaloin, and the like), acyloin ethers (e.g., benzoin methyl ether, benzoin ethyl ether, benzoin propyl ether, and the like), polynuclear quinones (anthraquinone, 1,4-naphthoquinone), acyl phosphine oxides, and the like. The initiator (D) is typically added in an amount of 0.01 to 10 parts by weight, preferably 0.5 to 5 parts by weight, per 100 parts by weight of the copolymer (A). Presently preferred initiators include benzyl dimethyl ketal, 2-ethyl anthraquinone, or mixtures thereof.

Polybutadienes contemplated for use in the above-described photopolymerizable resin compositions include 1,2-polybutadiene (cis-, trans-, or mixtures thereof), 1,4-polybutadiene (cis-, trans-, or mixtures thereof), maleic anhydride adducts of polybutadiene, which may then be modified via standard ring-opening techniques and subsequent (half) esterification or (half) amidation, and the like. Presently preferred polybutadiene used in the practice of the present invention is cis-1,2-polybutadiene.

Resin compositions employed in the practice of the present invention may also contain a plasticizer, which acts to reduce the glass transition temperature of the polymer, thereby easing processibility of the composition. Examples of plasticizers useful in the practice of the present invention include glycerin, ethoxylated phenols, ethoxylated glycerin, and the like.

Resin compositions employed in the practice of the present invention may further contain additives to improve processability and handling characteristics. Such additives include, for example, polyethylene waxes, paraffins, esters of stearic acid (such as sorbitol monostearate), ethylene—acrylic acid copolymers, polyhydroxy styrene, and the like.

If desired, for example, to increase storage stability of the resin compositions employed in the practice of the present invention, there may further be added a storage stabilizer such as hydroxyaromatic compounds (e.g., hydroquinone, p-methoxyphenol, p-t-butylcatechol, 2,6-di-t-butyl-p-cresol, pyrogallol, and the like); quinones (e.g., benzoquinone, p-toluquinone, p-xyloquinone, and the like); amines (e.g., N-phenyl-$\alpha$-naphthylamine, and the like); imidazoles (e.g., methyl-benzimidazole); and the like, in an amount of 0.01 to 2 parts by weight per 100 parts by weight of copolymer (A).

Presently preferred resin compositions for use in the practice of the present invention comprise, in addition to the above-described copolymer:

(B) in the range of about 5 up to 7 parts of said basic nitrogen-containing compound per 100 parts of said copolymer, (C) in the range of about 20 up to 30 parts of said ethylenically unsaturated monomer per 100 parts of said copolymer, (D) in the range of about 0.5 up to 2.5 parts photopolymerization initiator per 100 parts of said copolymer, and (E) in the range of about 1 up to 3 parts polybutadiene per 100 parts of said copolymer.

Vehicles contemplated for removal by the invention process include aqueous media, i.e., water, optionally containing base, acid, surfactant, and/or up to about 99 vol % organic media. Surfactants include cationic surfactants, nonionic surfactants and amphoteric surfactants.

Organic media contemplated for removal by the invention process include both water-miscible and water-immiscible materials. Examples include alcohols (e.g., ethanol, ethylene glycol, isopropyl alcohol, methanol, n-amyl alcohol, n-butyl alcohol, n-hexyl alcohol, propanol, propylene glycol, and the like), ketones (e.g., acetone, diethyl ketone, methyl ethyl ketone, methyl isobutyl ketone, and the like), esters (including alkyl, alkoxyalkyl and alkenyl acetates, e.g., amyl acetate, butyl acetate, ethyl acetate, isopropyl acetate, propylene glycol monomethyl acetate, vinyl acetate; alkyl and alkoxyalkyl glycolates, alkyl and alkoxyalkyl esters of higher saturated aliphatic carboxylic acids, dialkylene glycol dialkyl ethers, and the like) ethers (e.g., ethyl ether, butyl ether, and the like), chlorohydrocarbons, saturated and/or unsaturated cyclic hydrocarbons, saturated and/or unsaturated acyclic hydrocarbons, petroleum distillates, mineral oil fractions from which aromatics have been removed, and the like. Those of skill in the art recognize that some organic compounds are more readily removed from diluent-containing resins than others. Removal of such organic compounds may be facilitated by formation of an azeotrope with water.

The above-described resin compositions, when exposed to a suitable vehicle, e.g., in a washout process, will typically retain up to about 10 wt % vehicle, based on the weight of the resin coating. In accordance with the present invention, the concentration of vehicle can generally be reduced below about 1 wt %, based on the weight Of the resin coating, employing the invention method. A residual vehicle level of ≦0.5 wt % is presently preferred for further handling and application of the resin material.

One of the desirable characteristics of the preferred resin compositions noted above is their developability with water of substantially neutral Ph Thus, there is no need to use Ph modified (i.e., acidic or basic) media when developing the preferred resin compositions noted above. It is noted, however, that the invention process is applicable to the removal of a wide range of vehicles.

Those of skill in the art can readily identify microwave-compatible supports which are suitable for use in the practice of the present invention. Thus, supports contemplated for use in the practice of the present invention can be prepared of a variety of materials, e.g., metal, plastic, paper, wood, glass, ceramic, and the like. Exemplary support materials include steel, aluminum and plastic (e.g., polyester, such as polyethylene terephthalate). A presently preferred support material is polyethylene terephthalate.

A coating comprising the above-described resin compositions, dispersed in the above-described vehicles, can be applied to the above-described support in varying thicknesses. As recognized by those of skill in the art, coating thicknesses applicable to printing plate coatings generally exceed about 10 mils. The thickness of such coating is preferably within the range having as a low end point any integral value of between about 10 and 20 mils, and as an upper end point, any integral value of between about 70 and 250 mils. Exemplary ranges for the coating thickness include a range of 10 to 250 mils, a preferred range of 16 to 200 mils, with a presently preferred range of 20 to 130 mils.

Microwave energy to which a coated support is subjected in accordance with the present invention is typically sufficient to elevate the temperature of the vehicle-containing portions of the resin coating (typically the floor portion of the resin) for a time sufficient to reduce the concentration of vehicle in said resin to the target level. Since the vehicle bearing portions of the resin material will be more excitable by microwaves (than are substantially vehicle-free portions of the resin), these portions of the resin material will preferentially heat when exposed to microwaves. In order to achieve drying in a relatively short time, it is desirable that the temperature of the vehicle-containing portions of the resin coating be elevated substantially above room temperature, but not so high as to be detrimental to the microwave compatible support or the resin material thereon.

While those of skill in the art recognize that a wide range of microwave energies can be employed to accomplish the drying contemplated herein, typically, in order to achieve drying in a reasonable amount of time without damaging the resin or support therefor, the microwave energy to which the coated support is subjected will fall in the range of about 1 up to about 500 Watt-minutes/square inch, although higher and lower energy inputs can be used, depending on the rate of drying desired, the particular vehicle being removed, the amount of vehicle to be removed, the nature of the resin from which vehicle is being removed, the thickness of the resin being dried, ambient conditions (e.g., temperature, relative humidity, and the like), the volume and rate of flow of inert and/or dry atmosphere through the drying chamber, and the like. Presently preferred energy input for accomplishing the desired drying falls in the range of about 10 up to 300 Watt-minutes/square inch, with energy inputs in the range of about 25 up to 200 Watt-minutes/square inch being especially preferred.

In accordance with another embodiment of the present invention, there is provided an apparatus for reducing the level of vehicle in an article comprising vehicle-containing resin coated on a microwave-compatible support, said apparatus comprising:

containment means for said article to be treated, means for introducing said article into said containment means, means for removing said article from said containment means, means for controllably producing microwave energy, and means for removing vaporized vehicle from said containment means.

In accordance with a particular aspect of this embodiment of the invention, the above-described apparatus further comprises means for transporting said article through said containment means. As employed herein, "means for transporting" refers to any means for moving the article to be treated into and out of the range of the source of microwave energy. Thus, the article can be moved by hand, by a conveyer, by a turntable, on a tray, on a pallette, and the like.

In accordance with another aspect of this embodiment of the invention, the above-described apparatus further comprises means to monitor weight loss of said article. As employed herein, "means to monitor weight loss" refers to any means whereby the relative weight of the article being treated can be monitored from time to time to determine if any change in weight has occurred. Typically, such weight loss would be monitored with a scale.

In accordance with still another aspect of this embodiment of the invention, the above-described apparatus further comprises means to monitor loss of volatiles from said article during the drying treatment thereof. As employed herein, "means to monitor loss" refers to any means whereby volatiles released by the article during drying can be monitored from time to time to determine if additional volatiles are being driven off. Such loss could be monitored in a variety of ways, e.g., with an in-line gas chromatograph (which continuously or intermittently monitors the atmosphere released from the containment means), a humidostat, and the like.

In accordance with yet another aspect of this embodiment of the invention, the above-described apparatus further comprises means to monitor the temperature of said article. As employed herein, "means to monitor the temperature" refers to any suitable heat-sensing means, such as, for example, a thermocouple, a heat sensitive metal, a heat sensitive chemical composition, non-contact infrared (i.e., an IR thermometer), and the like. Such a component can be positioned in a variety of places, for example, at the backside of the support (to assess whether the support is being subjected to excessive heating), within (or on) the resin being treated (to assess whether the resin material being dried is being subjected to excessive heating), above the plate, below the plate, and the like.

In accordance with still another aspect of this embodiment of the invention, the above-described apparatus further comprises means to monitor residual levels of vehicle retained by said article. As employed herein, "means to monitor residual levels of vehicle" refers to a near infrared detector (which is capable of determining vehicle levels in the resin), and the like.

As employed herein, "containment means" for said article to be treated refers to any enclosure in which microwave treatment of an article can be carried out, such as, for example, a closed chamber, an elongated chamber through which the article to be treated can be transported, and the like.

As employed herein, "means for introducing" said article into said containment means refers to any opening through which the article to be treated can be introduced into the containment means. For example, the means for introducing can be a door, a slot large enough to accommodate the article to be treated, a curtain, and the like.

As employed herein, "means for removing" said article from said containment means refers to any opening through which the article to be treated can be withdrawn from the containment means. For example, the means for removing can be a door, a slot large enough to accommodate the article to be treated, a curtain, and the like.

As employed herein, "means for controllably producing microwave energy," refers to a microwave generator or microwave oscillator which is capable of producing microwave energies in the range required by the invention drying method. It is desirable to be able to control the microwave output of such a generator/oscillator so that the apparatus of the invention can be adapted for use with various size plates, having various resin compositions thereon, and various vehicle concentrations therein. Those of skill in the art can readily identify numerous ways to control the energy output of a microwave generator/oscillator, such as, for example, by using preset on/off cycle times, variable power levels, differential power levels, and the like. Optionally, the output of the microwave generator/oscillator can be coupled to one or more of the above-described monitoring means. Thus, the amount of microwave energy introduced into the containment means can be controlled as a function of the rate of loss of volatiles, the temperature of the resin being dried, and the like.

As employed herein, "means for removing vaporized vehicle from said containment means" refers to any suitable venting means, such as, for example, a blower (e.g., an air knife), a pump (e.g., a vacuum pump), and the like. As illustrated in greater detail in the Examples, the greater the flow of a relatively dry atmosphere pulled through the containment means while the resin-coated articles are being subjected to microwave irradiation, the more rapid is the invention drying process.

The invention will now be described in greater detail by reference to the following non-limiting examples.

EXAMPLE 1

Basic Description of the Microwave Unit Used

The microwave oven used in the following examples was a 600 watt homeowner quality oven fitted with a wind-up microwave turntable. The power of the unit was dampened down to 300 watts by using 500 ml bottles of water positioned in the corners of the microwave cavity. Air flow through the unit was adjusted by the addition of axial fans installed over the vents of the oven.

In order to establish the effect that varying the amount of air flow has on plate dryness, a series of plates were made. The plates used were 0.067" thick Flexcel (Trademark of Napp Systems Inc.) on a plastic support. Plates were exposed using a standard commercially available cold lamp exposure unit so as to form the floor of the plate. No main exposure was done. Each plate was processed under standard conditions using an FP-F (Trademark of Napp Systems Inc.) high pressure water spray processor. The plates were recovered prior to the drying section of the processor and dried using the basic microwave set-up described above. Various amounts of air flow were used during exposure to microwave energy and the amount of volatiles lost was monitored by weight loss. The mass of the plate was taken following each minute of microwave exposure for the first 12 minutes and after every 2 minutes for the duration of the test. The size of plate used was 4"×6".

As a reference standard, one plate was dried using a commercially available forced hot air Blue M (Trade name) oven. The amount of volatiles lost was monitored by weight loss after each 15 minutes of drying for the first 90 minutes and after each 30 minute cycle for the remainder of the test. The Blue M oven was maintained at 60° C. for the duration of the test. The standard drying time of the Flexcel™ plate under these conditions is 60 minutes. The amount of volatiles lost following the standard drying cycle was 4% by weight. The drying time required to achieve the same 4% weight loss using the microwave unit utilizing various amounts of air flow is as follows:

| No Supplemental Air Flow | >45 minutes |
| --- | --- |
| 27 CFM | 18 minutes |
| 50 CFM | 9 minutes |
| 75 CFM | 3 minutes |

These results clearly establish the desirability of supplemental air flow during the microwave drying process.

EXAMPLE 2

In order to establish a microwave drying cycle that was equivalent to the standard one hour forced air drying cycle used for Flexcel™ plates, two Flexcel™ plates were exposed using a standard commercially available cold lamp exposure unit. The total plate thickness was 0.067". The plates were imaged using a Flexcel™ test target used for laboratory plate evaluation. Each plate was processed under standard conditions using an FP-F™ high pressure water spray processor. The plates were recovered prior to the drying section of the processor. One of the plates was dried using the basic microwave set-up described in Example 1. The weight of the plate was taken following each minute of microwave exposure for the first 12 minutes and after every 2 minutes for the last 33 minutes of drying. Air flow through the oven was 75 CFM. The size of the plate used was 10"×10".

As a reference standard, one plate was dried using a commercially available forced hot air Blue M™ oven. The amount of volatiles lost was monitored by weight loss after each 5 minutes of drying for the first 30 minutes and after each 15 minute cycle for the next 30 minutes and following each 30 minute cycle for the remainder of the test. The Blue M oven was maintained at 60° C. for the duration of the test. A plot of the weight % volatiles lost for each plate was made, and is presented in FIG. 1.

Inspection of the Figure illustrates that the microwave equivalent drying time to achieve the same results as the standard 60 minute forced air oven drying time is only a 20 minute cycle.

EXAMPLE 3

Four Flexcel™ plates were exposed using a standard commercially available cold lamp exposure unit. The total plate thickness was 0.067". The plates were imaged using a Flexcel™ test target used for laboratory plate evaluation. Each plate was processed under standard conditions using an FP-F™ high pressure water spray processor. The plates were recovered prior to the drying section of the processor. Two of the plates were dried using the basic microwave set-up described in Example 1. The weight of each plate was taken following each minute of microwave exposure for the first 10 minutes and after every 2 minutes for the last 10 minutes of drying. Air flow through the oven was 75 CFM. The size of plate used was 10"×10". Two reference standard plates were made using Blue M™ as described in Example 1. A plot of wt % volatiles lost for each plate confirmed that all plates lost the same percentage of volatile materials.

Following the drying step, as described above, one microwave dried plate and one Blue M oven dried plate were post cured using a standard commercially available cold lamp exposure unit. The remaining 2 plates were not post cured. All 4 plates were subjected to analysis by differential photocalorimetry (DPC). The purpose of the analysis was to determine if a plate dried by microwave energy had different chemical reactivity than a plate dried by a conventional forced air oven. The DPC unit used for the analysis was a Dupont 930. The results of the analysis are presented in Table 1:

TABLE 1

| Drying Method | Post Cured | Plate Area Measured | ΔH (J/g) |
|---|---|---|---|
| Microwave | Yes | Relief | 4.0 ± 0.2 |
| Blue M | Yes | Relief | 3.8 ± 0.1 |
| Microwave | No | Relief | 6.4 ± 0.1 |
| Blue M | No | Relief | 6.4 ± 0.1 |
| Microwave | Yes | Floor | 4.0 ± 0.3 |
| Blue M | Yes | Floor | 4.6 ± 0.2 |
| Microwave | No | Floor | 14.0 ± 0.4 |
| Blue M | No | Floor | 13.9 ± 0.4 |

The results of the above-described tests show that there is no difference in the reactivity of the image (relief) or non-image (floor) portions of plates dried using a conventional forced air oven when compared to microwave dried plates.

EXAMPLE 4

Four Flexcel™ plates were exposed using a standard commercially available cold lamp exposure unit. The total plate thickness was 0.067". The plates were imaged using a Flexcel™ test target used for laboratory plate evaluation. Each plate was processed under standard conditions using an FP-F™ high pressure water spray processor. The plates were recovered prior to the drying section of the processor. Two of the plates were dried using the basic microwave set-up described in Example 1. The weight of each plate was taken following each minute of microwave exposure for the first 10 minutes and after every 2 minutes for the last 10 minutes of drying. Air flow through the oven was 75 CFM. The size of the plate used was 10"×10". Two reference standard plates were made using the Blue M™ oven as described in Example 1. A plot of the wt % volatiles lost for each plate confirmed that all plates lost the same percentage of volatile materials.

Following the drying step, as described above, one microwave dried plate and one Blue M dried plate were post cured using a standard commercially available cold lamp exposure unit. The remaining 2 plates were not post cured. All four plates were tested for water content using the Aquastar™ V1B Titrator (EM Science). The conditions used for the water extraction were as follows:
Sample size: 0.03600 g±0.0500 g
Sample Configuration: 8–13 ¼" circular punches
Extraction Solvent: 100 ml Methanol
Wait time before beginning titration: 10 Minutes
Time to end of titration: 30 Minutes
The purpose of the analysis was to determine if a plate dried by microwave energy had a different water content than a plate dried by a conventional forced air oven. The results of the analysis are summarized in Table 2:

TABLE 2

| Drying Method | Post Cured | Plate Area Measured | Water Content % |
|---|---|---|---|
| Microwave | Yes | Relief | 0.47 ± 0.10 |
| Blue M | Yes | Relief | 0.44 ± 0.06 |
| Microwave | No | Relief | 0.47 ± 0.08 |
| Blue M | No | Relief | 0.56 ± 0.06 |
| Microwave | Yes | Floor | 0.44 ± 0.10 |
| Blue M | Yes | Floor | 0.46 ± 0.07 |
| Microwave | No | Floor | 0.49 ± 0.07 |
| Blue M | No | Floor | 0.51 ± 0.11 |

There is no significant difference in water content between microwave dried plates and plates dried using a conventional forced air oven. Indeed, the plates obtained by each method of drying are surprisingly similar, there being virtually no difference in the residual water content as a function of the method of drying used.

EXAMPLE 5

To check the applicability of microwave drying on plates from a variety of sources, drying profiles were done on Flexceed (Trade name of Supratech) and Nyloflex Aqua (Trade name of BASF). For each product two plates were exposed using a standard commercially available cold lamp exposure unit. The total plate thickness was 0.067". The plates were imaged using a Flexcel™ test target used for laboratory plate evaluation. Each plate was processed using an FP-F™ high pressure water spray processor. The plates were recovered prior to the drying section of the processor.

One each of the plates were dried using the basic microwave set-up described in Example 1. The weight of the plate was taken following each minute of microwave exposure for the first ten minutes and after every two minutes for the last ten minutes of drying. Air flow through the oven was 75 CFM. The size of plate used was 10"×10".

Figure 2A:
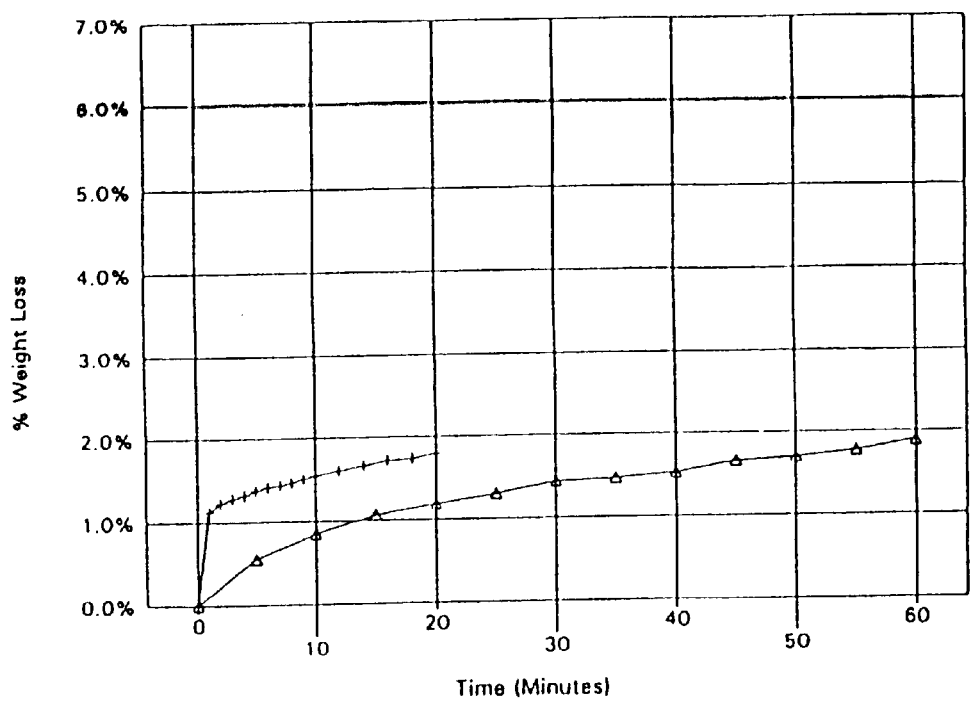
FIG. 2A compares the drying profile of Flexceed™ (trademark of Supratech) photopolymerizable plates in a forced air oven (maintained at ~60° C., denoted by empty triangles, Δ, in the figure) and in a microwave (operating at 300 Watts, denoted by "+" in the figure). Ten inch square plates were employed.
Figure 2B:
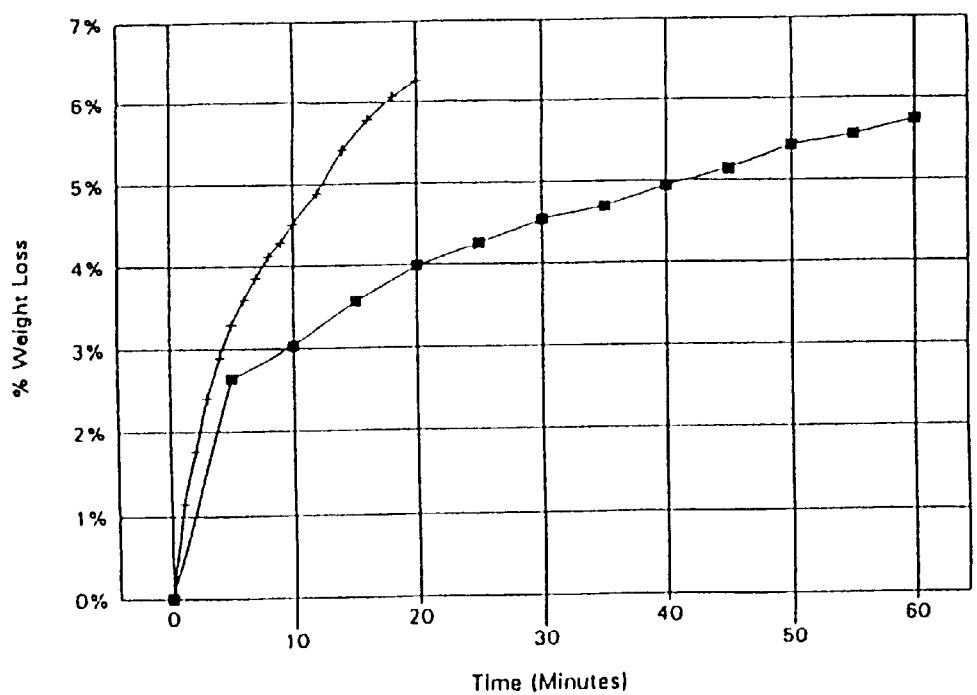
FIG. 2B compares the drying profile of Nyoflex Aqua™ (trademark of BASF) photopolymerizable plates in a forced air oven (maintained at ~60° C., denoted by darkened boxes, ■ , in the figure) and in a microwave (operating at 300 Watts, denoted by "+" in the figure). Ten inch square plates were employed.

Two reference standard plates were made using the Blue M™ oven as described in Example 1. The weight loss for each plate was recorded following each five minute drying cycle for the duration of the complete sixty minute drying cycle used. The results of the test were plotted and are presented in FIGS. 2A and 2B.

The graphs show that a twenty minute microwave drying cycle is equal to sixty minutes of drying in a forced hot air oven. This held true even though the percentage by weight of volatiles was three times higher for the BASF material than what was obtained with the Supratech material. Because the percentage loss by weight of volatiles was so different between the three types of plates, an analysis of water content was performed on each of the plates prior to drying. The equipment and techniques used in Example 4 were employed for the water analysis. The results of the analysis are presented in Table 3.

TABLE 3

| Plate | % Residual Water |
|---|---|
| Flexceed ™ | |
| floor | 1.2 |
| relief | 0.3 |
| Flexcel ™ | |
| floor | 3.2 |
| relief | 0.6 |
| Nyoflex-Aqua ™ | |
| floor | 7.0 |
| relief | 0.8 |

The Supratech plate had about half as much initial moisture as the Flexcel™ plate; the BASF plate had about twice as much initial moisture content as the Flexcel™ plate. These results agree very well with the percentage weight loss data. The differences in weight loss for the three different plates are readily explainable by initial water contents and not by the loss of other volatile components.

EXAMPLE 6

Four Nyloflex Aqua™ plates were exposed using a standard commercially available cold lamp exposure unit. The total plate thickness was 0.067". The plates were imaged using a Flexcel™ test target used for laboratory plate evaluation. Each plate was processed using an FP-F™ high pressure water spray processor. The plates were recovered prior to the drying section of the processor. Two of the plates were dried using the basic microwave set-up described in Example 1. The weight of the plate was taken following each minute of microwave exposure for the first ten minutes and after every two minutes for the last ten minutes of drying. Air flow through the oven was 75 CFM. The size of plate used was 10"×10".

Two reference standard plates were made using the Blue M™ oven as described in Example 1. A plot of the wt % volatiles lost for each plate confirmed that all plates lost the same percentage of volatile materials.

Following the drying step, as described above, one microwave dried plate and one Blue M dried plate were post cured using a standard commercially available cold lamp exposure unit. The remaining two plates were not post cured. All four plates were tested for water content using the Aquastar V1B Titrator (Trade name of EM Science). The conditions used for the water extraction were as follows:

Sample Size: 0.03600 g±0.0500 g
Sample Configuration: 8–13 ¼" circular punches
Extraction Solvent: 100 ml Methanol
Wait time before beginning titration: 10 Minutes
Time to end of titration: 30 Minutes The purpose of the analysis was to determine if a plate dried by microwave energy had a different water content than a plate dried by a conventional forced air oven.

Consistent with the results obtained in Example 4 (employing plates prepared with a different chemical formulation), no significant difference in water content is observed between microwave dried plates and plates dried using a conventional forced air oven. Indeed, the plates obtained by each method of drying are surprisingly similar, there being virtually no difference in the residual water content as a function of the method of drying used.

EXAMPLE 7

Two Flexcel™ plates were exposed using a standard commercially available cold lamp exposure unit. The total plate thickness was 0.067". The plates were imaged so that one half of the plate was a solid (relief) and the other half was a non-image (floor). The plates were processed under standard conditions using an FP-F™ high pressure water spray processor. The plates were recovered prior to the drying section of the processor. One plate was dried using the basic microwave set-up described in Example 1. Air flow through the oven was 75 CFM. The size of plate used was 10"×10". A total of four non-reversible TL-E-170 temperature indicator eight dot labels (Omega Engineering Inc.) were attached to the plate. The four labels were positioned as follows:

One on the back of each half (relief and floor) of the plate.
One on the resin surface of each half (relief and floor) of the plate.

It had been established from previous work that the temperature indicator labels are not sensitive to microwave energy. The cycle time used for drying was two ten minute cycles. The results are summarized in Table 4.

TABLE 4

| Microwave Drying Time (Minutes) | Temperature Relief/Back (° F.) | Temperature Relief/Resin (° F.) | Temperature Floor/Back (° F.) | Temperature Floor/Resin (° F.) |
|---|---|---|---|---|
| 0 | <170 | <170 | <170 | <170 |
| 10 | <170 | 170 | 200 | 200 |
| 20 | <170 | 170 | 200 | 200 |

The second plate was used as a reference standard plate and was dried using the Blue M™ oven at a temperature of 180° F. As with the microwave dried plate, a total of four non-reversible TL-E-170 temperature indicator eight dot labels (Omega Engineering Inc.) were attached to the plate. The four labels were positioned as follows:

One on the back of each half (relief and floor) of the plate.
One on the resin surface of each half (relief and floor) of the plate.

The plate was removed from the oven every fifteen minutes for the complete sixty minute drying cycle and checked for the indicated temperature. The results are summarized in Table 5.

TABLE 5

| Blue M Drying Time (Minutes) | Temperature Relief/Back (° F.) | Temperature Relief/Resin (° F.) | Temperature Floor/Back (° F.) | Temperature Floor/Resin (° F.) |
| --- | --- | --- | --- | --- |
| 0 | <170 | <170 | <170 | <170 |
| 15 | 170 | 170 | 170 | 170 |
| 30 | 180 | 180 | 180 | 180 |
| 45 | 180 | 180 | 180 | 180 |
| 60 | 180 | 180 | 180 | 180 |

The temperature difference between the floor of the plate and the relief of the microwave dried plate is appoximately 30° F. In contrast, there was no difference in temperature seen between the floor and relief of the Blue M™ dried plate.

EXAMPLE 8

Two Nyloflex Aqua™ plates were exposed using a standard commercially available cold lamp exposure unit. The total plate thickness was 0.067". The plates were imaged so that one half of the plate was a solid (relief) and the other half was a non-image (floor). The plates were processed using an FP-F™ high pressure water spray processer. The plates were recovered prior to the drying section of the processor. One plate was dried using the basic microwave set-up described in Example 1. Air flow through the oven was 75 CFM. The size of plate used was 10"×10". A total of four non-reversible TL-E-170 temperature indicator eight dot labels (Omega Engineering Inc.) were attached to the plate. The four labels were positioned as follows:

One on the back of each half (relief and floor) of the plate.
One on the resin surface of each half (relief and floor) of the plate.

It had been established from previous work that the temperature indicator labels were not sensitive to microwave energy. The temperature indicators on the plate were checked following each minute of microwave exposure for the first ten minutes and after every two minutes for the last ten minutes of drying. The results are summarized in Table 6.

TABLE 6

| Microwave Drying Time (Minutes) | Temperature Relief/Back (° F.) | Temperature Relief/Resin (° F.) | Temperature Floor/Back (° F.) | Temperature Floor/Resin (° F.) |
| --- | --- | --- | --- | --- |
| 0–5 | <170 | <170 | <170 | <170 |
| 6 | <170 | <170 | 170 | <170 |
| 7 | <170 | <170 | 170 | 170 |
| 8 | <170 | <170 | 180 | 170 |
| 9 | <170 | <170 | 180 | 180 |
| 10 | <170 | <170 | 210 | 200 |
| 12 | <170 | <170 | 210 | 200 |
| 14 | <170 | <170 | 210 | 200 |
| 16 | <170 | <170 | 210 | 210 |
| 18 | <170 | 170 | 210 | 220 |
| 20 | <170 | 180 | 210 | 230 |

The second plate was used as a reference standard plate and was dried using the Blue MD™ oven at a temperature of 180° F. As with the microwave dried plate, a total of four non-reversible TL-E-170 temperature indicator eight dot labels (omega Engineering Inc.) were attached to the plate. The four labels were positioned as follows:

One on the back of each half (relief and floor) of the plate.
One on the resin surface of each half (relief and floor) of the plate.

The plate was removed from the oven every fifteen minutes for the complete sixty minute drying cycle and checked for the indicated temperature. The results are summarized in Table 7.

TABLE 7

| Blue M Drying Time (Minutes) | Temperature Relief/Back (° F.) | Temperature Relief/Resin (° F.) | Temperature Floor/Back (° F.) | Temperature Floor/Resin (° F.) |
| --- | --- | --- | --- | --- |
| 0 | <170 | <170 | <170 | <170 |
| 15 | 170 | 170 | 170 | 170 |
| 30 | 180 | 180 | 180 | 180 |
| 45 | 180 | 180 | 180 | 180 |
| 60 | 180 | 180 | 180 | 180 |

Although plates prepared employing a different chemical formulation were used in this example, relative to Example 7, similar results were obtained. Thus, in this example, the temperature difference between the floor of the plate and the relief of the microwave dried plate is approximately 50° F. Consistent with the results obtained in Example 7, there was no difference in temperature seen between the floor and relief portions of the Blue M™ (Trade name) dried plate employed herein.

While the invention has been described in detail with reference to certain preferred embodiments thereof, it will be understood that modifications and variations are within the spirit and scope of that which is described and claimed.

That which is claimed is:

1. A method of producing a printing plate, said method comprising:
   (a) selectively exposing to crosslinking conditions a coating comprising a photosensitive, polymerizable resin which is dispersed in a suitable vehicle and which has been applied to a microwave-compatible support, thereby producing a coating of an image exposed resin on a support, wherein said coating has a thickness in the range of 10 to 250 mils,
   (b) developing said image exposed resin and
   (c) subjecting said developed resin to microwave energy in an amount sufficient to substantially reduce the concentration of said vehicle in said coating.

2. A method according to claim 1 wherein said concentration of said vehicle is sufficiently reduced to produce a functional printing plate.

3. A method according to claim 2 wherein said polymerizable resin is capable of crosslinking to produce a substantially insoluble coating on said microwave-compatible support.

4. A method according to claim 3 further comprising removing non-crosslinked resin from said microwave-compatible support by washing with a suitable solvent.

5. A method according to claim 1 wherein said resin further contains a thermally sensitive dye therein.

6. A method according to claim 1 wherein said resin is exposed to electromagnetic radiation sufficient to cause at least a portion thereof to cure, and uncured resin is thereafter removed from said support by washing with aqueous media.

7. A method according to claim 1 wherein said vehicle is aqueous media.

8. A method according to claim 7 wherein said aqueous media is water, optionally containing base, acid, surfactant, and/or up to 99 vol % organic media.

9. A method according to claim 8 wherein said surfactant is a cationic surfactant, a nonionic surfactant or an amphoteric surfactant.

10. A method according to claim 8 wherein said organic media is an alcohol, a ketone, an ester or an ether.

11. A method according to claim 1 wherein the concentration of said vehicle is reduced below about 1 wt. %, based on the weight of the coating.

12. A method according to claim 1 wherein the temperature of a floor portion of the coating is elevated substantially above room temperature, but not so high as to be detrimental to the microwave compatible support.

13. A method according to claim 1 wherein the microwave energy to which said coated support is subjected falls in the range of about 1 up to about 100 Watt-minutes/square inch.

14. A method according to claim 1 wherein said microwave compatible support is prepared from metal, paper, plastic, wood, glass or ceramic.

15. A method according to claim 14 wherein said plastic is a polyester.

16. A method of preparing a printing plate wherein said printing plate comprises a photosensitive, polymerizable resin coating which has been applied in a suitable vehicle to a microwave-compatible support, and which has been selectively exposed and developed, said method comprising:

drying said exposed and developed resin by subjecting said resin to microwave energy in an amount sufficient to substantially reduce the concentration of said vehicle in said coating.

17. A method of preparing a printing plate wherein said printing plate comprises a photosensitive, polymerizable resin coating which has been applied in a suitable vehicle to a microwave-compatible support, and which has been exposed, said method comprising:

(a) developing said exposed resin, and (b) drying said exposed and developed resin by subjecting said exposed and developed resin to microwave energy in an amount sufficient to substantially reduce the concentration of said vehicle in said coating.

* * * * *